United States Patent [19]
Byrn et al.

[11] Patent Number: 5,977,837
[45] Date of Patent: Nov. 2, 1999

[54] PHASE SELECTOR FOR EXTERNAL FREQUENCY DIVIDER AND PHASE LOCKED LOOP

[75] Inventors: Jonathan William Byrn, Kasson; Chad B. McBride; Brian Andrew Schuelke, both of Rochester, all of Minn.

[73] Assignee: International Business Machines Corporation, Armonk, N.Y.

[21] Appl. No.: 09/071,447

[22] Filed: May 1, 1998

[51] Int. Cl.[6] .............................. H03L 7/06; H03L 7/16; H03K 21/38

[52] U.S. Cl. .......................... 331/1 A; 331/25; 331/45; 331/74; 331/DIG. 2; 327/115; 327/142; 327/147; 327/295

[58] Field of Search ............................. 331/1 A, 18, 25, 331/45, 60, 61, 74, DIG. 2; 327/115, 142, 147–150, 295

[56] References Cited

U.S. PATENT DOCUMENTS

| | | |
|---|---|---|
| 4,206,425 | 6/1980 | Nossen . |
| 4,360,788 | 11/1982 | Erps et al. . |
| 4,600,895 | 7/1986 | Landsman . |
| 4,999,526 | 3/1991 | Dudley . |
| 5,124,572 | 6/1992 | Mason et al. . |
| 5,517,147 | 5/1996 | Burroughs et al. . |
| 5,557,224 | 9/1996 | Wright et al. ........................... 327/115 |

Primary Examiner—David Mis
Attorney, Agent, or Firm—Joan Pennington

[57] ABSTRACT

A method for removing an external frequency divider and clock formation circuit from a feedback path of a phase locked loop and a phase selector circuit are provided for synchronizing an external frequency divider with a reference clock of a phase locked loop. A reference clock signal is applied to the phase locked loop. An output of the phase locked loop is coupled through a predefined delay and provides a delayed feedback clock signal input to the phase locked loop. The external frequency divider is located at the output of the phase locked loop external to the predefined delay and outside the feedback clock signal path of the phase locked loop. A phase selector circuit identifies a correct phase of the reference clock signal and starts the external frequency divider. The phase selector circuit includes an edge detector, a synchronization divider, and a reset machine.

15 Claims, 14 Drawing Sheets

PRIOR ART

PHASE SELECTOR FOR EXTERNAL FREQUENCY DIVIDER AND PHASE LOCKED LOOP

FIELD OF THE INVENTION

The present invention relates to phase locked loop architectures, and more particularly to, a method for removing an external frequency divider from a feedback path of a phase locked loop and a phase selector circuit used to synchronize an external frequency divider with a reference clock of a phase locked loop.

DESCRIPTION OF THE PRIOR ART

Phase locked loop (PLL) circuits are widely used in many different applications. Microprocessors require on-chip clock generation. When implementing a PLL on a CMOS microprocessor or other logic chip, frequency dividers often are included in the synchronization path of the phase locked loop circuit.

Figure 1:
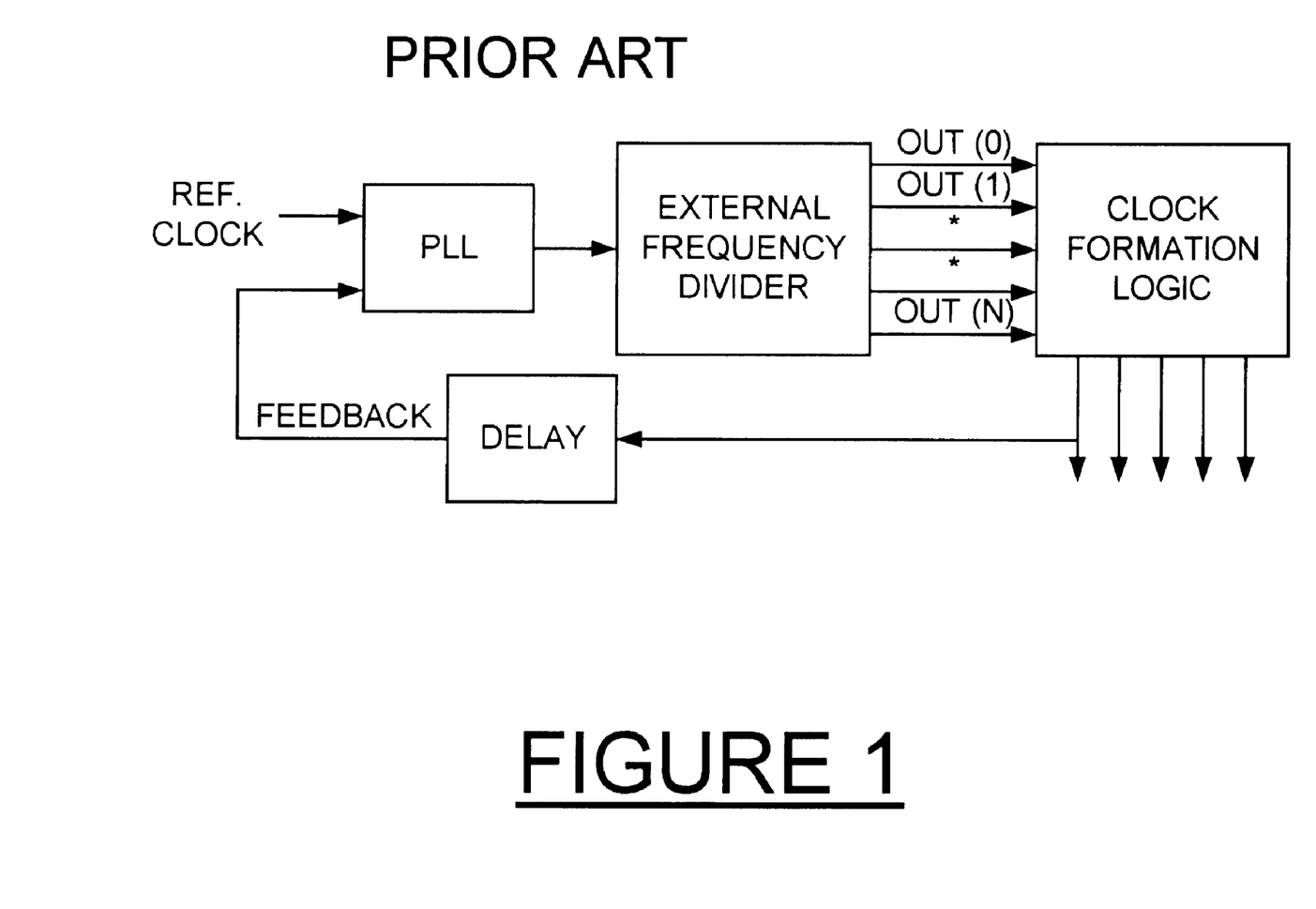
FIG. 1 is a block diagram representation of a prior art phase locked loop (PLL) circuit and an external frequency divider coupled to clock formation logic with the divider in the synchronization path of the phase locked loop circuit.

For example, FIG. 1 illustrates a prior art phase locked loop (PLL) circuit with an external frequency divider coupled to clock formation logic. In the conventional arrangement of FIG. 1, the external frequency divider together with a clock formation circuit is included in the synchronization path of the phase locked loop circuit. The clock formation circuit includes a clock formation logic block and a clock distribution tree indicated by arrows at the output of the clock formation logic. A delay shown in the feedback path between the clock distribution tree and the feedback input of the phase locked loop represents a receiver circuitry delay for the reference clock signal. With the external frequency divider included in the synchronization path of the phase locked loop circuit, the stability of the PLL is degraded. Also with a certain level of division provided by the external frequency divider, the PLL stops functioning.

A way is needed to synchronize an external frequency divider to the reference clock of a phase locked loop (PLL) without placing the divider in the feedback path of the PLL. A need exists for such a mechanism where the stability of the PLL can be preserved across all modes of operation while providing the benefits of an external frequency divider for applications such as on-chip clock formation.

SUMMARY OF THE INVENTION

A principal object of the present invention is to provide a method for removing an external frequency divider from a feedback path of a phase locked loop and a phase selector circuit for synchronizing an external frequency divider with a reference clock of a phase locked loop. Other objects are to provide such method and phase selector circuit substantially without negative effects and that overcome many of the disadvantages of prior art arrangements.

In brief, a method for removing an external frequency divider and clock formation circuit from a feedback path of a phase locked loop and a phase selector circuit are provided for synchronizing an external frequency divider with a reference clock of a phase locked loop. A reference clock signal is applied to the phase locked loop. An output of the phase locked loop is coupled through a predefined delay and provides a delayed feedback clock signal input to the phase locked loop. The external frequency divider is located at the output of the phase locked loop external to the predefined delay and outside the feedback clock signal path of the phase locked loop. A phase selector circuit identifies a correct phase of the reference clock signal and starts the external frequency divider.

The phase selector circuit includes an edge detector, a synchronization divider, and a reset machine. The edge detector receives the reference clock signal of the phase locked loop. The edge detector is clocked by a delayed feedback clock signal of the phase locked loop. The edge detector detects a rising edge of the reference clock signal and outputs a signal. The outputted signal of the edge detector is asserted for one full cycle of the delayed feedback clock signal. The synchronization divider receives the outputted signal from the edge detector. The synchronization divider is clocked by the delayed feedback clock signal of the phase locked loop. The synchronization divider detects a lock state and outputs a lock signal. The lock signal is asserted for one full cycle of the delayed feedback clock. The reset machine receives the lock signal from the synchronization divider. The reset machine is clocked by a delayed outputted signal from the edge detector. The reset machine asserts a reset signal for one full cycle of the reference clock signal until the locked signal is detected. The reset signal is applied to the external frequency divider.

BRIEF DESCRIPTION OF THE DRAWING

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 2:
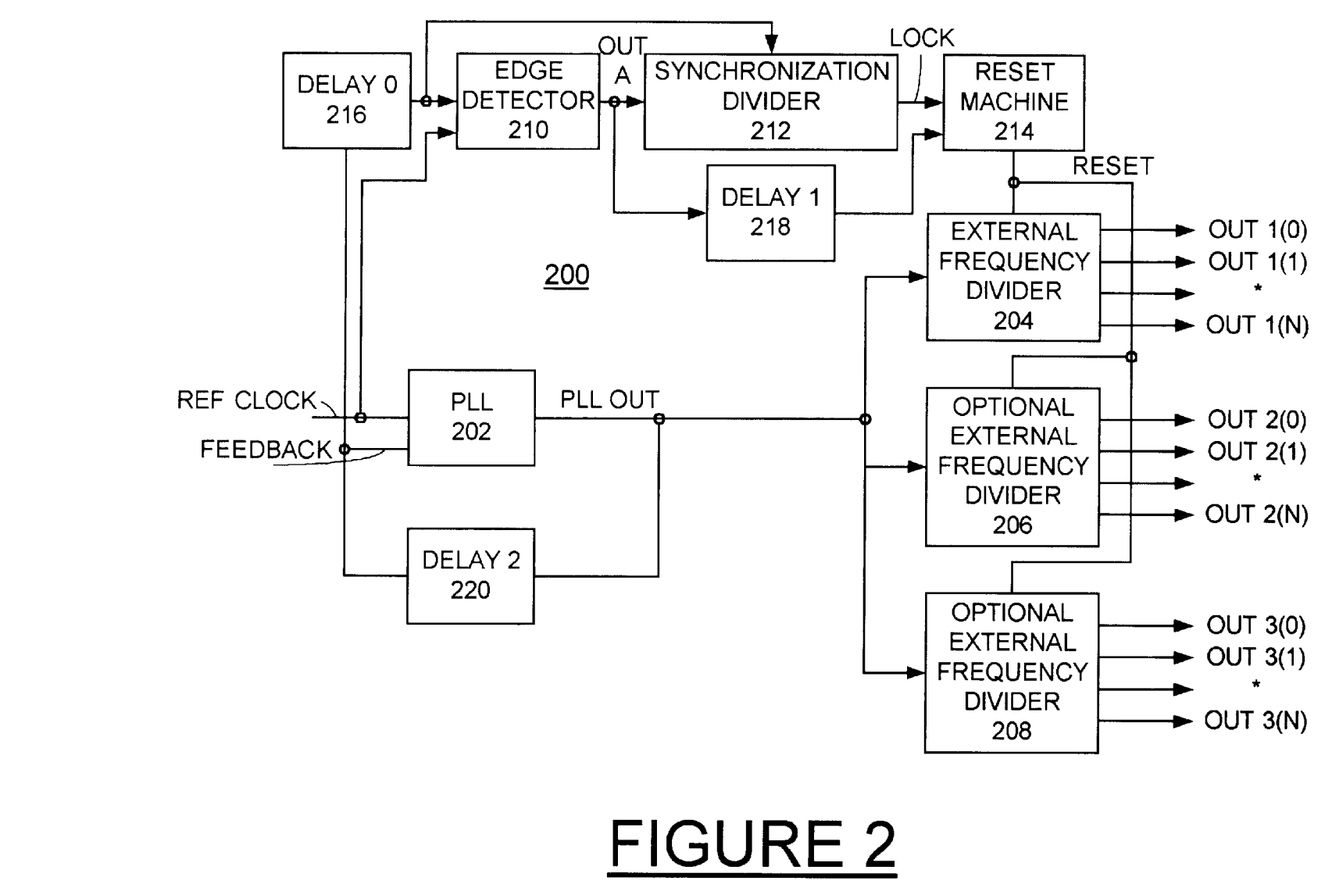
FIG. 2 is a schematic and block diagram representation of a phase selector circuit used to synchronize an external frequency divider with a reference clock of a phase locked loop (PLL) of the preferred embodiment.

Having reference now to the drawings, in FIG. 2 there is shown a phase selector circuit generally designated by the reference character 200 and arranged in accordance with the preferred embodiment. The phase selector circuit 200 is used with a phase locked loop (PLL) 202 and at least one external frequency divider 204. Additional optional external frequency dividers 206 and 208 are shown in FIG. 2. The external frequency dividers 204, 206 and 208 are connected to the output of the PLL 202.

In accordance with features of the preferred embodiment, the phase selector circuit 200 synchronizes each of the external frequency dividers 204, 206 and 208 with a reference clock of the PLL 202 without providing the external frequency dividers 204, 206, and 208 in the feedback path of the PLL 202. The phase selector circuit 200 enables the use of the external frequency dividers 204, 206 and 208 at the output of the phase locked loop (PLL) 202 without degrading the stability of the PLL 202 or limiting the granularity of the external frequency dividers 204, 206 and 208. The phase selector circuit 200 utilizes the PLL 202 with no logic in the feedback path of the PLL 202 other than a delay 2 220. The phase selector circuit 200 aligns a plurality of external frequency dividers 204, 206 and 208 to a reference clock signal of the PLL indicated at a line REF CLOCK applied to the PLL 202.

Phase selector circuit 200 includes an edge detector 210, a synchronization divider 212, and a reset machine 214. Each external frequency dividers 204, 206 and 208 have reset capability to the extent that a reset can occur from within any state in the dividers 204, 206 and 208. A reset signal is applied to each external frequency dividers 204, 206 and 208 from the output of the reset machine 214 indicated at a line labeled RESET. All sequential logic used within the phase selector circuit 200 including the edge detector 210, the synchronization divider 212, and the reset machine 214 are edge sensitive or positive edge triggered devices.

Phase selector circuit 200 includes a first delay labeled DELAY 0 216 providing a delayed feedback clock signal to the edge detector 210. The reference clock signal REF CLOCK of the PLL 202 is applied to an input of the edge detector 210. The function of the edge detector 210 is to detect the rising edge of the reference clock signal REF CLOCK and immediately output a signal OUT A that is asserted for one full cycle of the delayed feedback clock. The PLL 202 does not see the delay 0 216, while the delay 216 is needed so that the edge detector 210 is clocked after the reference clock signal REF CLOCK has risen. The delay 216 ensures immediate detection of the rising edge of the reference clock signal with a tolerance or predefined setup time based on the size of the delay 216 used between the feedback input (FEEDBACK) to the PLL 202 and the edge detector 210. The output OUT A of the edge detector 210 is applied to the synchronization divider 212.

Figure 4:
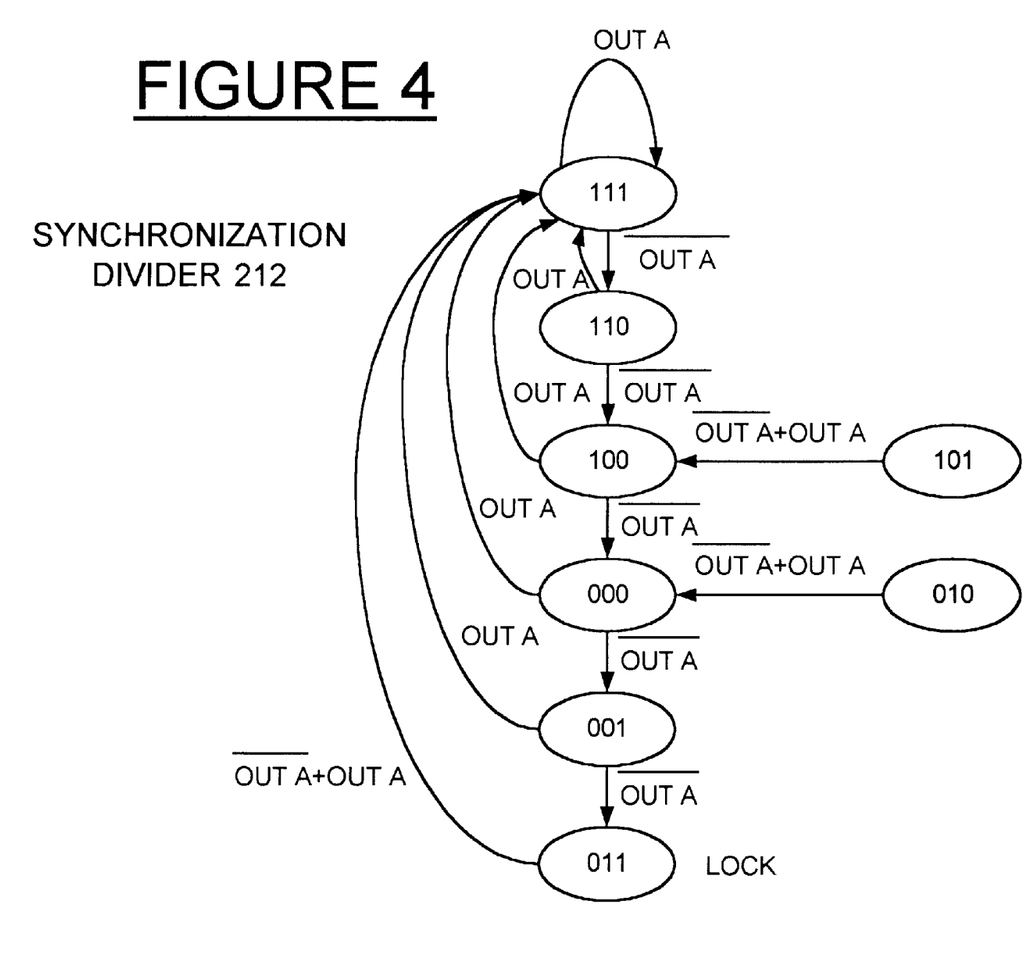
FIG. 4 is a state diagram of a synchronization divider of the phase selector circuit of FIG. 2 of the preferred embodiment.

Synchronization divider 212 determines when the correct phase of the reference clock has been found. This is accomplished by clocking the synchronization divider 212 with the delayed feedback clock signal output of delay 0 216. This is the same delayed feedback clock signal used for clocking the edge detector 210. Operation of the phase selector circuit 200 requires that the divide magnitude of the synchronization divider 212 be equal to the frequency of the feedback clock FEEDBACK divided by the frequency of the reference clock signal REF CLOCK. The synchronization divider 212 provides a positive or logical one lock signal output with the detected correct phase of the reference clock at its output labeled LOCK. The synchronization divider 212 has reset capability to the extent that a reset can occur from within any state in the synchronization divider 212. As illustrated and described with respect to FIG. 4 below, the synchronization divider 212 resets to state 7 (indicated as I7 in FIGS. 7A, 7B, 7C, 7D, 7E, 7F, 7G, and 7H) when reset from within any of six sequential operational states I7, I3, I1, 10, I4 and I6. The LOCK output only occurs when the synchronization divider 212 is in state I6 or 011, as shown in FIG. 4. Operation of synchronization divider 212 requires that upon reset from any of the six sequential operational states I7, I3, I1, I0, I4 and I6, the next state of the synchronization divider 212 is the state immediately following the state 6 that issues the LOCK signal which is state 7, as shown in FIG. 4. By so doing, the synchronization divider 212 resets every time a rising edge of the reference clock signal REF CLOCK is detected by the edge detector 210 at OUT A. The synchronization divider 212 reaches the lock state 6 to issue the LOCK signal when the correct phase is found, and from that point on, the LOCK signal is aligned with OUT A of the edge detector 210.

The function of the reset machine 214 is to latch the LOCK signal and to issue a reset signal at its output labeled RESET until the LOCK signal is received from the synchronization divider 212 aligned with the output OUT A of the edge detector 210. The reset machine 214 is clocked using a delayed output of the edge detector via a delay 1 218. The reset machine 214 holds the reset asserted or non-asserted signal for the duration of at least one full cycle of the reference clock signal REF CLOCK. The RESET signal output of the reset machine 214 is applied to the external frequency dividers 204, 206 and 208. By so doing the external dividers 204, 206 and 208 are continually reset until the synchronization divider 212 is locked.

In accordance with features of the preferred embodiment, the delay 2 220 in the feedback path of PLL 202 consists of delay books representing the delay of one of the external dividers 204, 206, and 208 together with the delay of the clock formation logic and clock distribution tree as shown in FIG. 1. Delay 2 220 also includes delay representing the conventional PLL feedback delay of the receiver circuitry delay for the reference clock signal. The delay 2 220 is substantially equal to the resulting delay with one external frequency divider and clock formation circuitry connected in the feedback path of the PLL 202.

Referring to FIGS. 3, 4, 5, and 6, state diagrams of the edge detector 210, the synchronization divider 214, and the reset machine 214 of the phase selector circuit 200 and of the external frequency divider 204 are shown. In FIGS. 3, 4, 5, and 6, the least significant bit (LSB) is the left most bit. Referring also to FIGS. 7A, 7B, 7C, 7D, 7E, 7F, 7G and 7H, timing diagrams illustrating different start up conditions for the phase selector circuit 200 are shown. The reference clock signal REF CLOCK received by the PLL 202 is shown at a line REF CLOCK=1 in FIGS. 7A, 7B, 7C, 7D, 7E, 7F, 7G and 7H. The output of the PLL 202 is shown in FIGS. 7A, 7B, 7C, 7D, 7E, 7F, 7G and 7H at a line PLLOUT=1. The feedback signal of the PLL 202 is shown at a line labeled FEEDBACK in FIGS. 7A, 7B, 7C, 7D, 7E, 7F, 7G and 7H.

Figure 3:
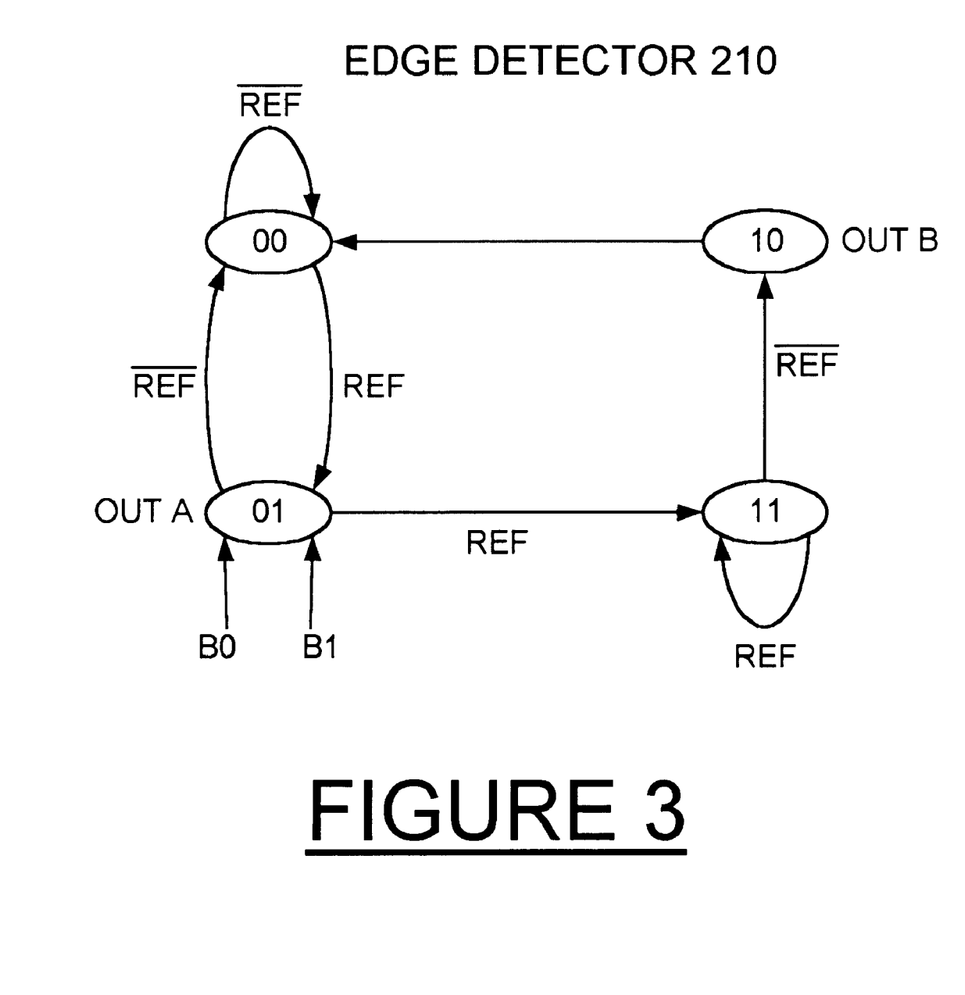
FIG. 3 is a state diagram of an edge detector of the phase selector circuit of FIG. 2 of the preferred embodiment.

In FIG. 3, the illustrated state diagram of the edge detector 210 includes state bits B0, B1. Current state bits are indicated at a pair of lines labeled B0_0=0, B1_0=1 in FIGS. 7A, 7B, 7C, 7D, 7E, 7F, 7G and 7H. Next state bits of the edge detector 210 are indicated at a pair of lines B0_0N=0, B1_0N=1 in FIGS. 7A, 7B, 7C, 7D, 7E, 7F, 7G and 7H. The detected rising edge of reference clock output OUT A of the edge detector 210 is indicated at a line OUTA=0 in FIGS. 7A, 7B, 7C, 7D, 7E, 7F, 7G and 7H. The next state bits of the edge detector 210 are represented as:

B0_0N=(B0_0B1_0)+(REF CLOCK·B1_0);

and

B1_0N=(B0_0·REF CLOCK)+(B1_0·REF CLOCK);

where·represents a logical AND operation and + represents a logical OR operation. In the illustrated state diagram of FIG. 3, an illustrated available OUT B is not used within the phase selector circuit 200. The available OUT B could be used for falling edge detection is needed.

In FIGS. 7A, 7B, 7C, 7D, 7E, 7F, 7G and 7H, sequential ones of the states I0–I7 for the synchronization divider 212 are indicated at a line labeled B_2=4. FIG. 4 provides a state diagram of the synchronization divider 212 including eight possible states I0 through I7. As shown in FIG. 4, the divide magnitude of the synchronization divider 212 is six, where the frequency of the PLL feedback clock is six times the frequency of the reference clock signal REF CLOCK. State I6 or 011 in FIG. 4 issues the LOCK signal when the correct phase is found. The synchronization divider 212 receives the edge detector output signal OUT A and checks its state for the locked state I6 or 001. When the locked state I6 is not found with the received edge detector output signal OUT A, the synchronization divider 212 does not issue the LOCK signal and resets to state I7 as indicated at multiple lines labeled OUT A from each of the six sequential states I7 or 111, I3 or 110, I1 or 100, I0 or 000, and I4 or 001, in FIG. 4. State I7 or 111 is the next state of the synchronization divider 212 immediately following the locked state I6. States I2 or 010 and 5 or 101 are only possible as initial start up states of the synchronization divider 212 and are not required to reset to state 7. After the synchronization divider 212 is reset to state I7 or 111, at the next rising edge of the delayed feedback clock with OUT A not asserted, the synchronization divider 212 goes to the next sequential state I3 or 110. Then synchronization divider 212 continues to the next sequential state I1 or 100 at the next rising edge of the delayed feedback clock with OUT A not asserted. The synchronization divider 212 continues to the next sequential states I0, I4, I6 with OUT A not asserted.

Figure 7A:
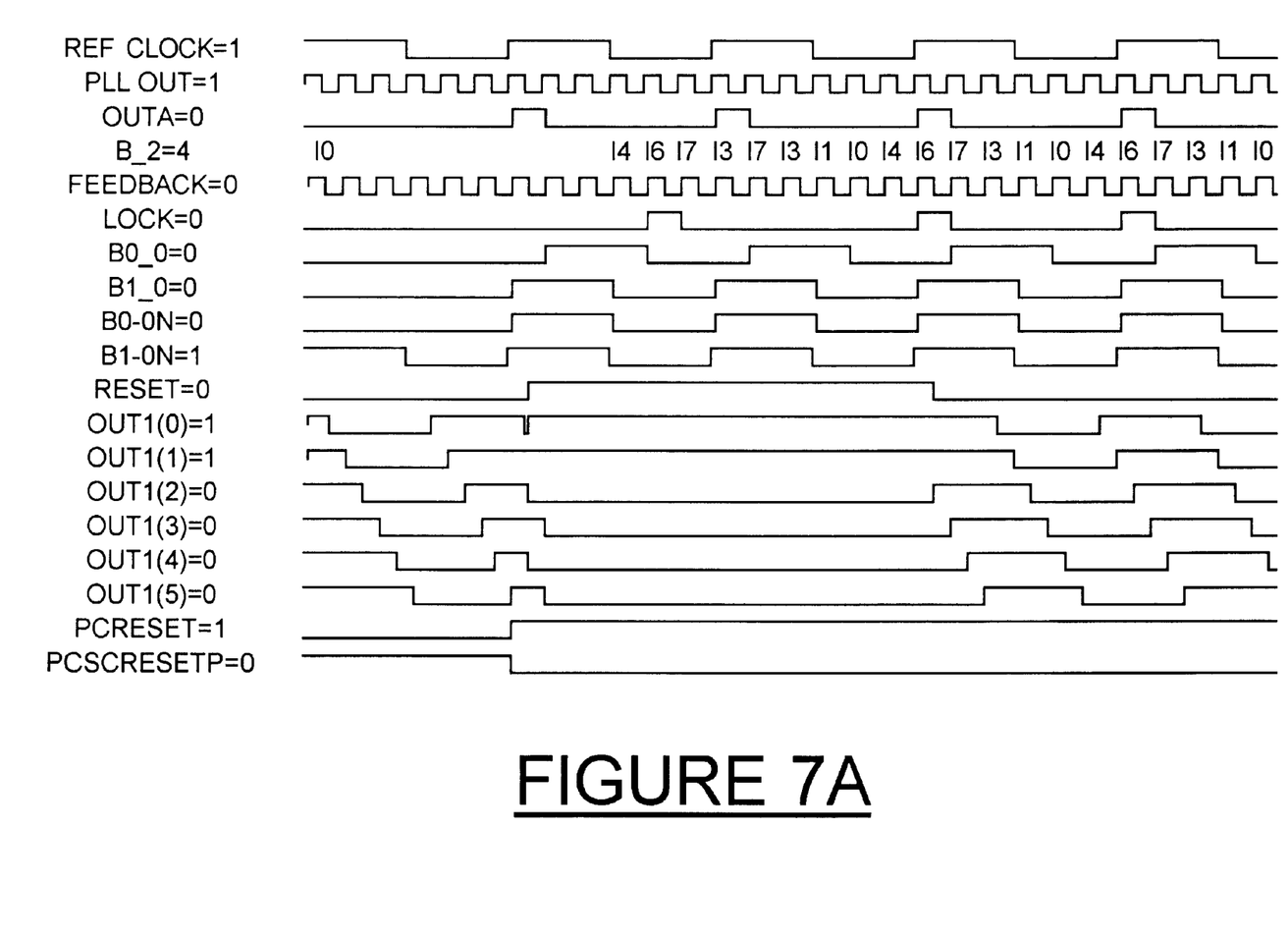
FIGS. 7A, 7B, 7C, 7D, 7E, 7F, 7G and 7H are timing diagram charts illustrating operation of the phase selector circuit of FIG. 2 of the preferred embodiment with different start up conditions for the phase selector circuit.
Figure 7B:
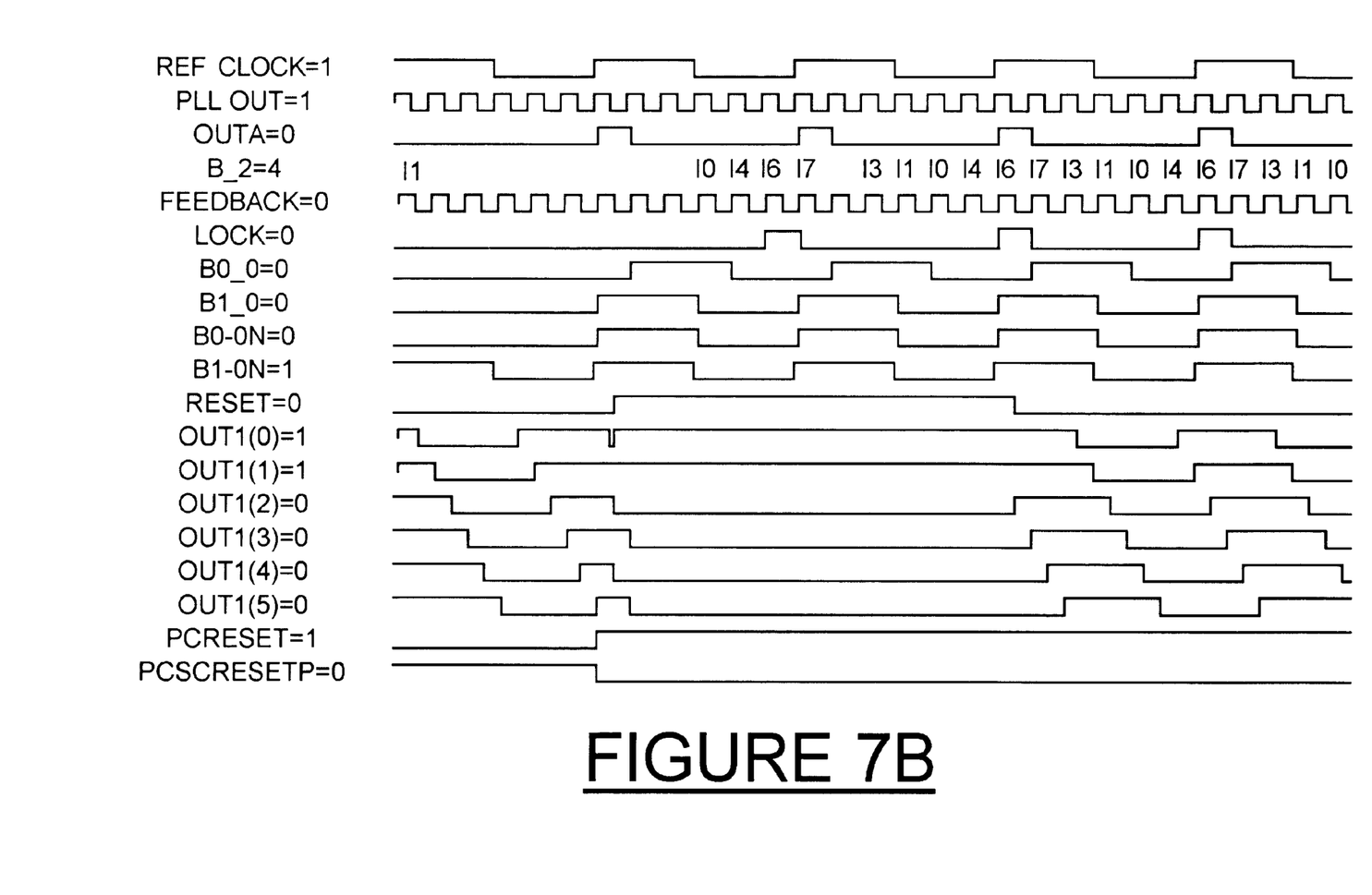
Figure 7C:
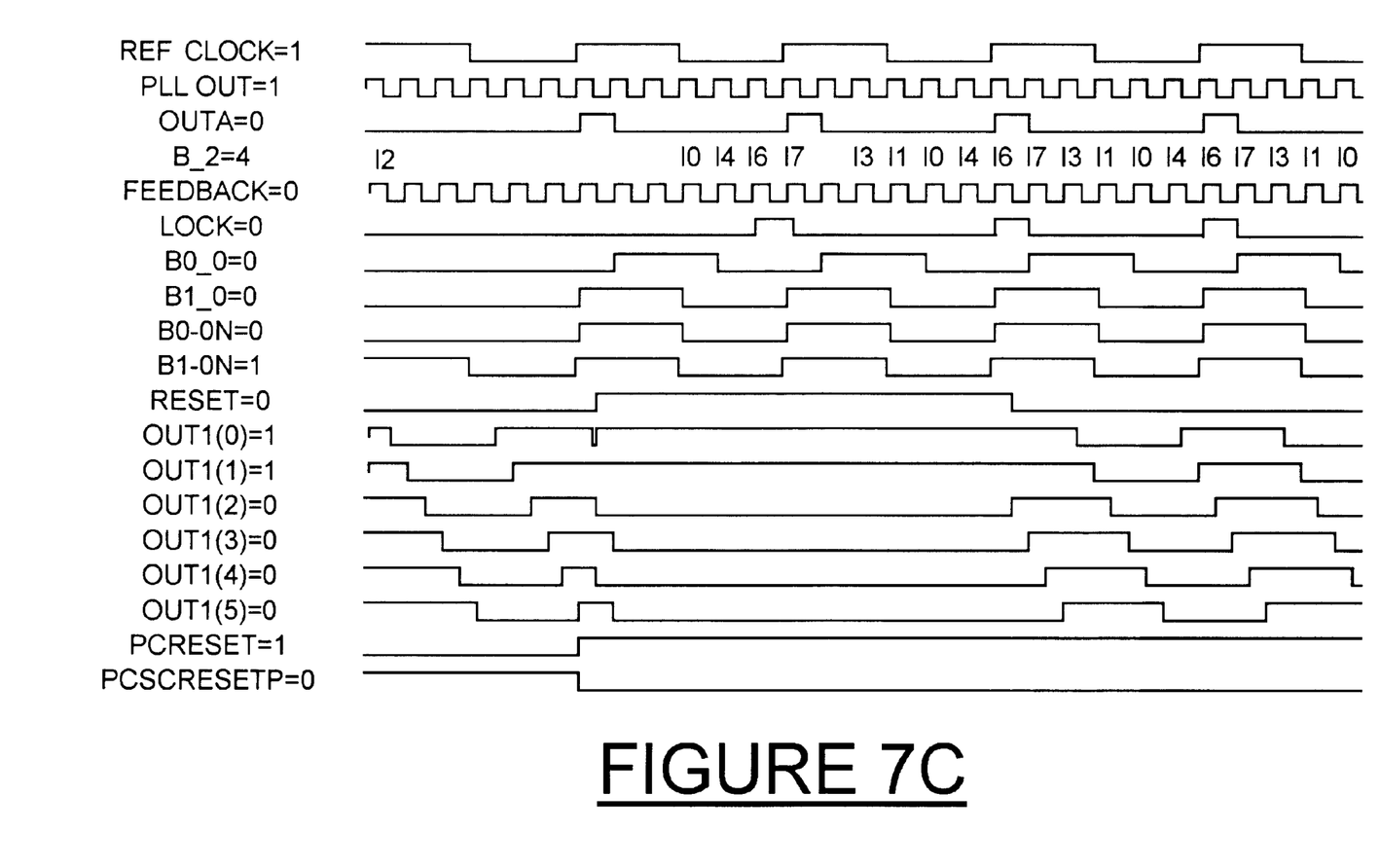
Figure 7D:
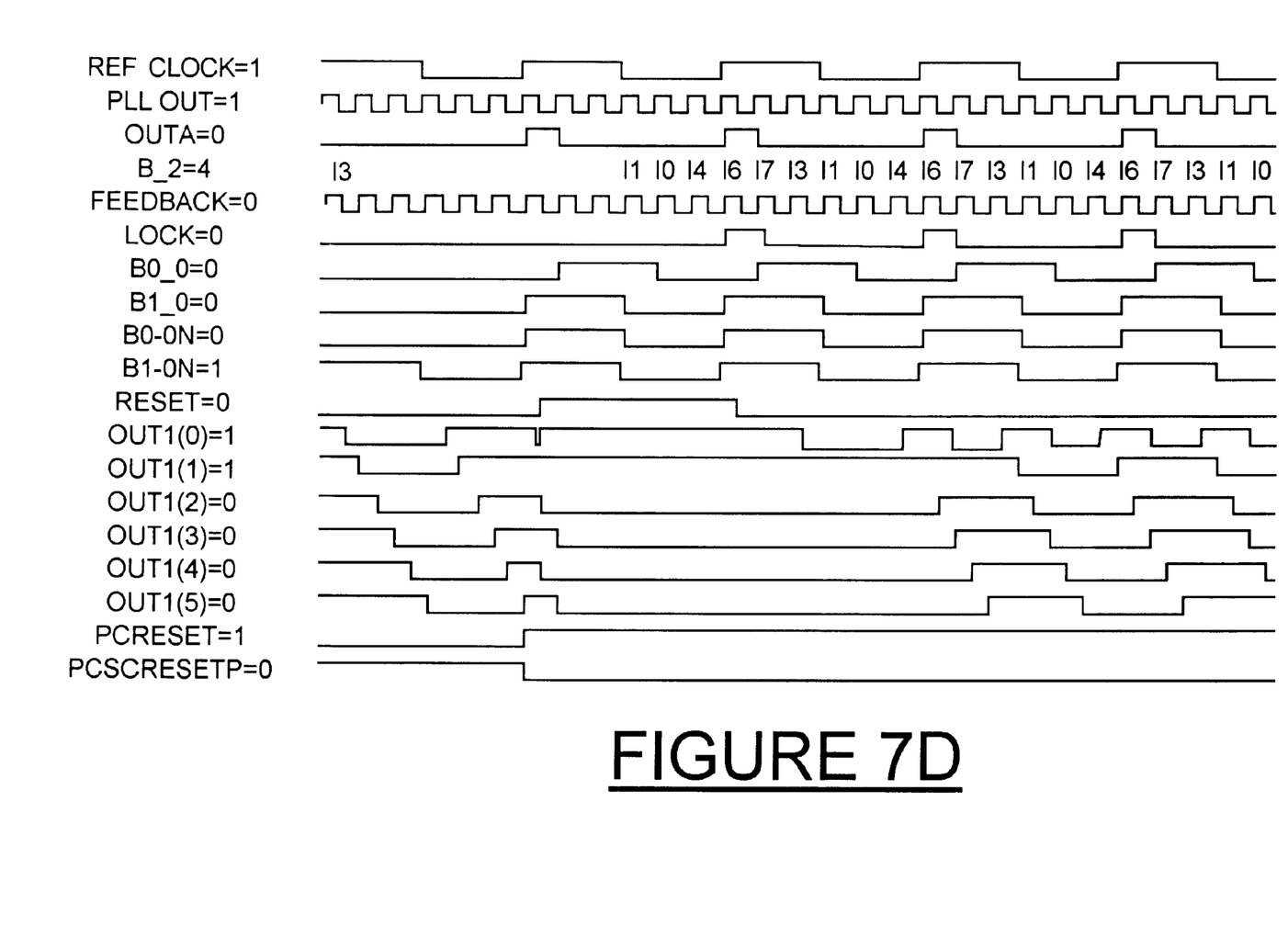
Figure 7E:
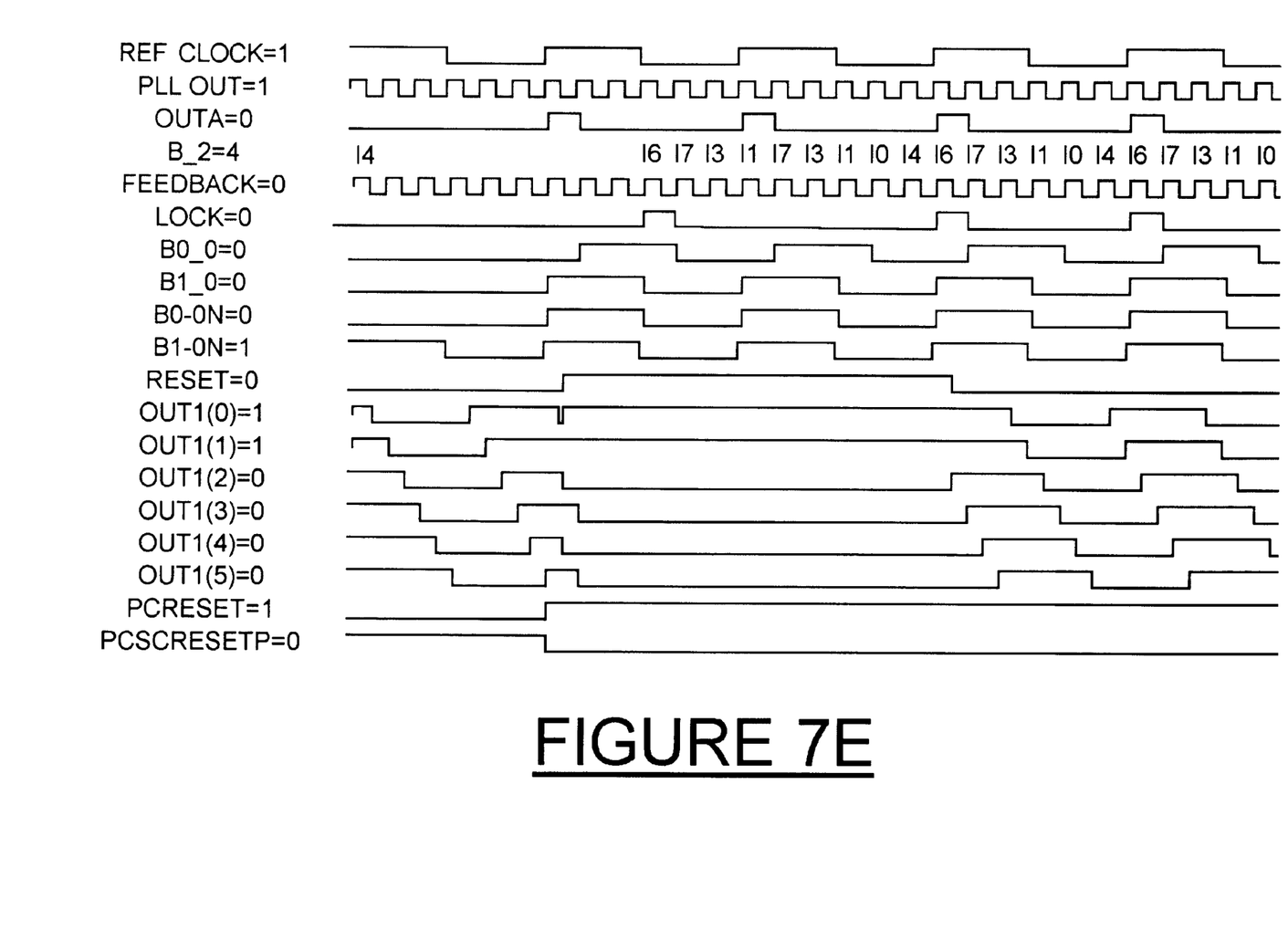
Figure 7F:
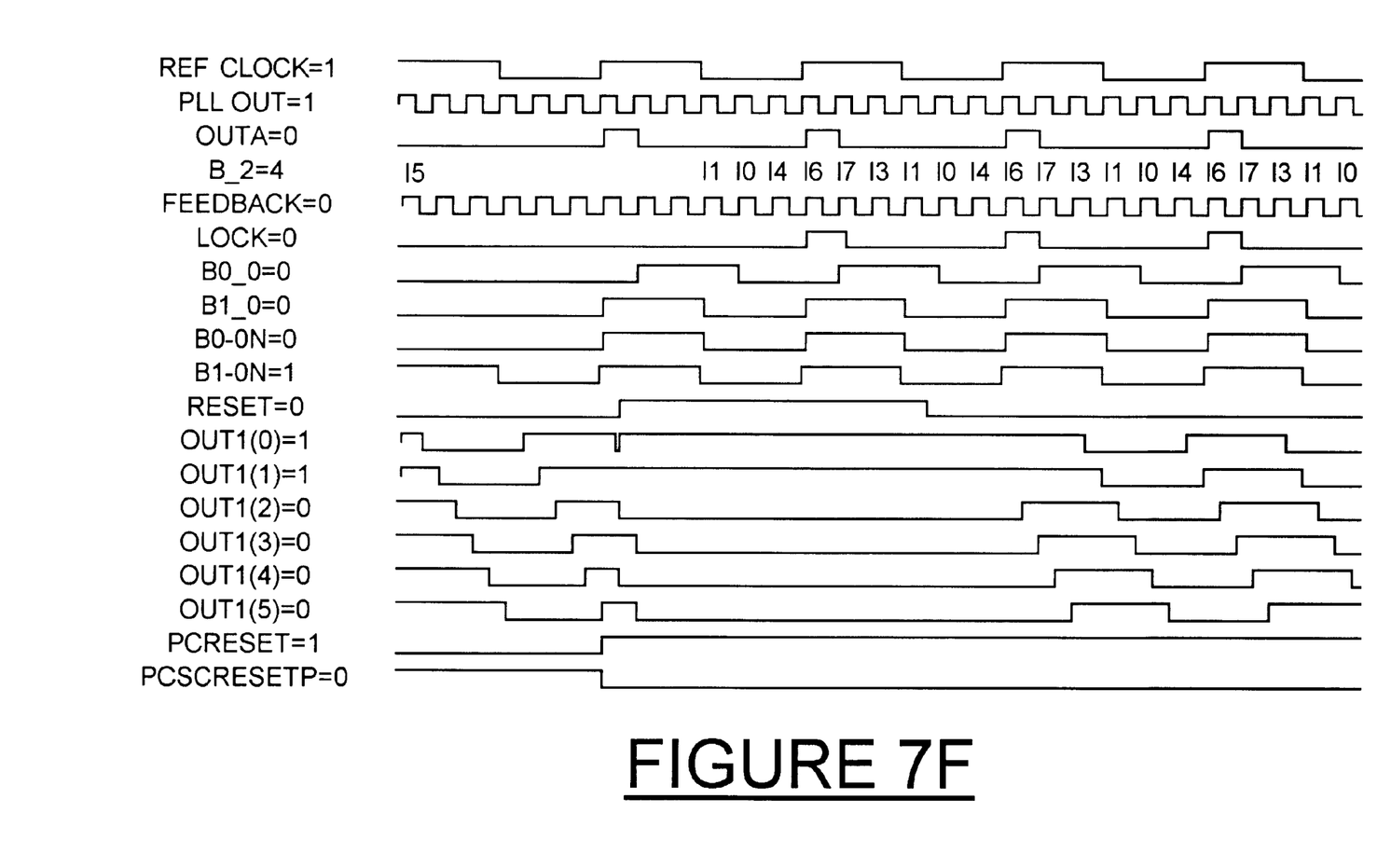
Figure 7G:
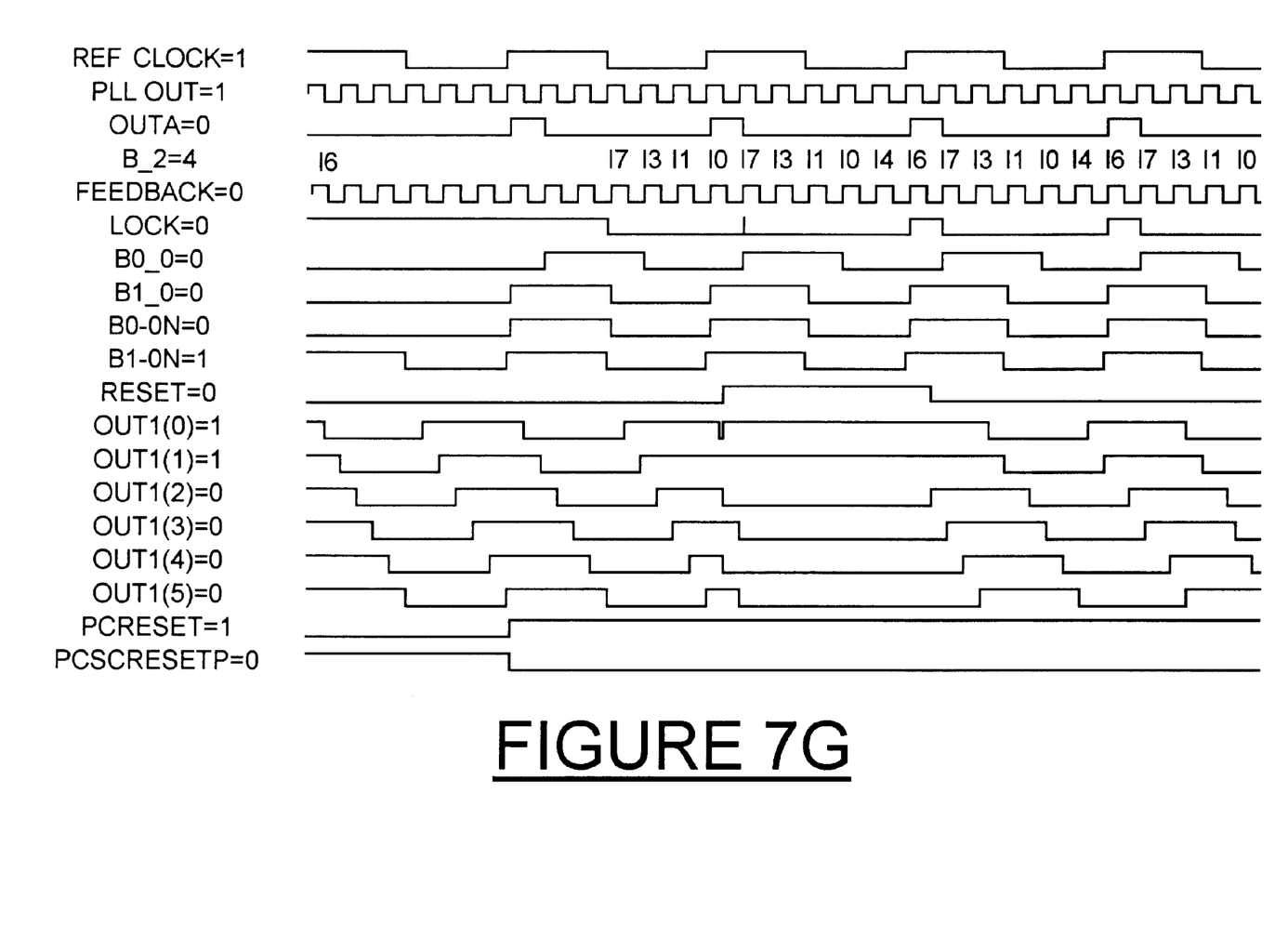
Figure 7H:
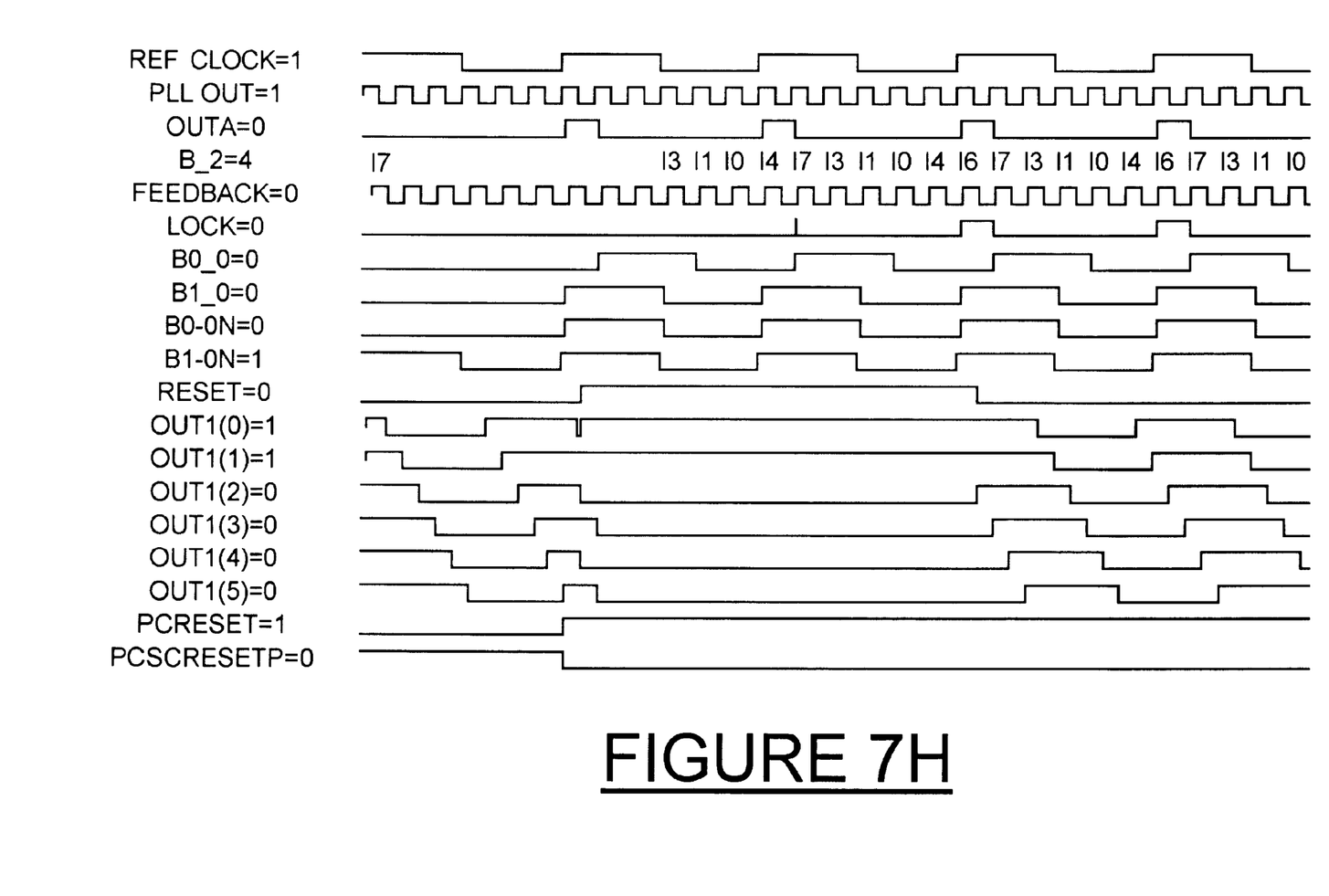

In FIGS. 7A, 7B, 7C, 7D, 7E, 7F, 7G and 7H, the output of the synchronization divider 212 is illustrated at a line labeled LOCK. In FIG. 7A, an initial start up state I0 of the synchronization divider 212 is shown at line B_2=4. In FIG. 7B, an initial state I1 of the synchronization divider 212 is shown at line B_2=4. FIGS. 7C, 7D, 7E, 7F, 7G and 7H respectively show an initial state of I2, I3, I4, I5, I6, and I7 of the synchronization divider 212 at line B_2=4.

Referring initially to FIG. 7A, the initial state I0 is held until an asynchronous reset indicated at a line PCRESET is asserted or goes to a logic level one. The next sequential states of the synchronization divider 212 are states I4, I6, and I7 after a next OUT A is received. At the second illustrated OUT A, the synchronization divider 212 is at state I7 and resets itself to state I7. Then the next sequential states of the synchronization divider 212 are states I3, I1, I0, I4, I6 when a next OUT A is received. The synchronization divider 212 is at the locked state when the third OUT A is received. Then the synchronization divider 212 issues the LOCK signal and resets itself to state I7. Then the locked state I6 continues to be aligned with OUT A of the edge detector 210. As shown, the next sequential states of the synchronization divider 212 are I3, I1, I0, I4, and I6 when the next OUT A is received. The synchronization divider 212 is at the locked state I6 when the next or fourth illustrated OUT A is received. In FIG. 7A, the asserted LOCK signal is aligned with the OUT A for the third and fourth illustrate OUT A.

Having reference to FIGS. 7B, 7C, 7D, 7E, 7F, 7G and 7H with respective start up conditions of state I1, I2, I3, I4, I4, I5, I6, and I7, respective sequential states of the synchronization divider 212 are shown. With each of the different start up conditions, the synchronization divider 212 functions to reach the locked state I6 so that the LOCK signal is aligned with the OUT A.

Figure 5:
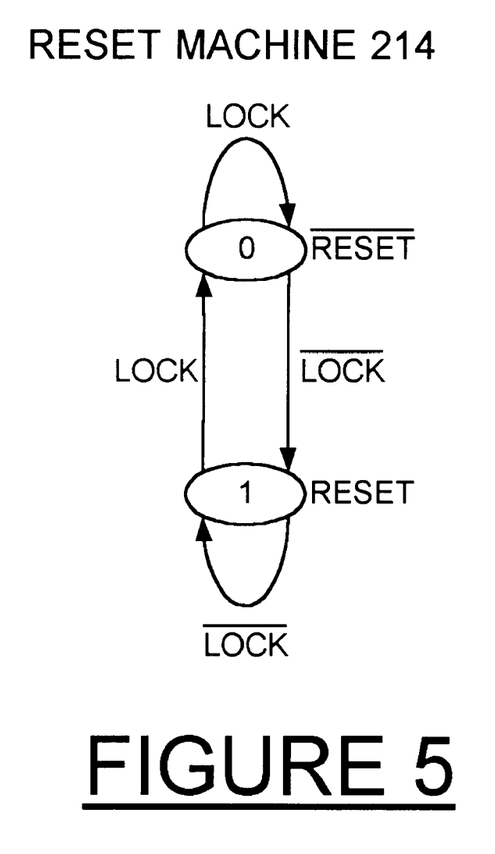
FIG. 5 is a state diagram of a reset machine of the phase selector circuit of FIG. 2 of the preferred embodiment.

FIG. 5 shows a state diagram for the reset machine 214. At state 1, the RESET signal is issued by the reset machine 214 to reset the external frequency dividers 204, 206, 208. At state 0, the RESET not asserted signal is issued by the reset machine 214 enabling normal operation of the external frequency dividers 204, 206, 208. The reset machine 214 is clocked by the delayed OUT A signal and stays in state 0 when the LOCK signal is outputted by the synchronization divider 212. The output of the reset machine 212 is illustrated at a line labeled RESET in FIGS. 7A, 7B, 7C, 7D, 7E, 7F, 7G and 7H.

Figure 6:
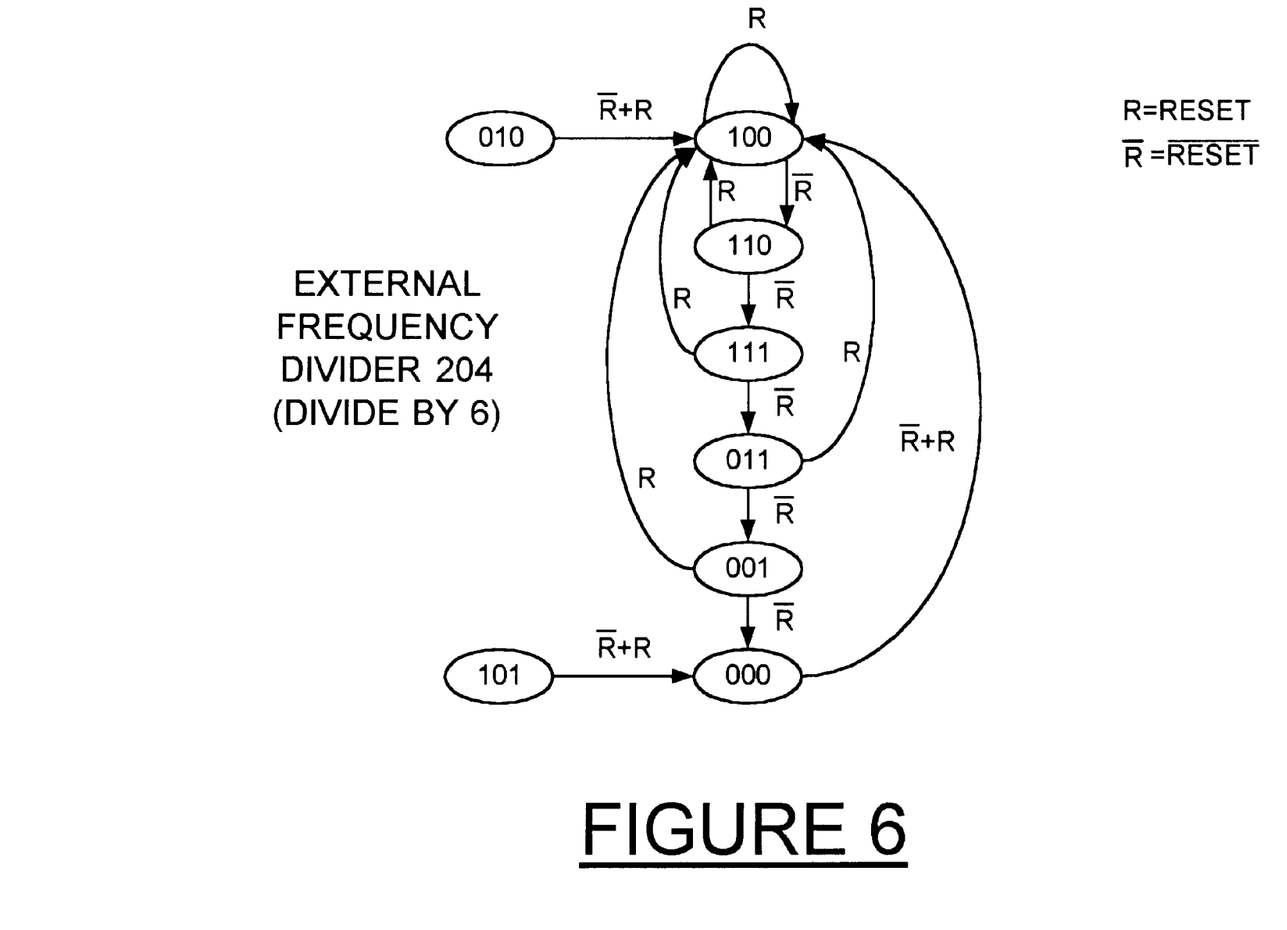
FIG. 6 is a state diagram of an external frequency divider used with the phase selector circuit of FIG. 2 of the preferred embodiment.

FIG. 6 shows a state diagram for the external frequency dividers 204 for a divide by 6 implementation. The six outputs of the external frequency dividers 204 for a divide by 6 implementation are illustrated at lines labeled OUT1 (0)=1, OUT1(1)=1, OUT1(2)=0, OUT1(3)=0, OUT1(4)=0, and OUT1(5)=0 in FIGS. 7A, 7B, 7C, 7D, 7E, 7F, 7G and 7H. The RESET asserted signal issued by the reset machine 214 resets the external frequency dividers 204, 206, 208 and is indicated at multiple lines labeled R between states 1, 3, 7, 6, 4, and 0. The RESET not asserted signal issued by the reset machine 214 enabling the external frequency dividers 204, 206, 208 is indicated at multiple lines labeled R bar. Each of the six states 1, 3, 7, 6, 4, and 0 of the external frequency divider 204 is reset to state 1 responsive to the RESET asserted signal R issued by the reset machine 214. The external frequency divider 204 with RESET not asserted goes from state 1 to the next states 3, 7, 6, 4 and 0, as shown in FIG. 6. Nonsequential possible states 2 and 5 are respectively reset to state 1 and state 0 responsive to the RESET asserted signal R or RESET not asserted signal R bar.

Referring again to FIGS. 7A, 7B, 7C, 7D, 7E, 7F, 7G and 7H with each of the different start up conditions, OUT1(1) of the external frequency divider 204 is aligned with the rising edge of OUT A within one reference clock cycle REF CLOCK after the synchronization divider 212 reaches the locked state I6 where the LOCK signal is aligned with the OUT A. Thus with each possible start up condition, the phase selector circuit 200 functions as required to synchronize the external frequency divider 204 with the reference clock signal REF CLOCK of the PLL 202. As shown, OUT1(2), OUT1(3), OUT1(4), OUT1(5), and OUT1(0) of the external frequency divider 204 are sequentially offset by ⅙ of one reference clock cycle REF CLOCK with respect to OUT1(1).

While the present invention has been described with reference to the details of the embodiments of the invention shown in the drawing, these details are not intended to limit the scope of the invention as claimed in the appended claims.

What is claimed is:

1. A phase selector circuit used to synchronize an external frequency divider with a reference clock signal of a phase locked loop, the external frequency divider located at the output of the phase locked loop outside the feedback clock signal path of the phase locked loop, said phase selector circuit comprising:

an edge detector receiving the reference clock signal, said edge detector being clocked by a delayed feedback clock signal of the phase locked loop, said edge detector detecting a rising edge of the reference clock signal and outputting a signal, said outputted signal being asserted for one full cycle of said delayed feedback clock;

a synchronization divider receiving said outputted signal from said edge detector, said synchronization divider being clocked by said delayed feedback clock signal of the phase locked loop, said synchronization divider detecting a lock state and outputting a lock signal; said lock signal being asserted for one full cycle of said delayed feedback clock; and a reset machine for receiving said lock signal from said synchronization divider, said reset machine being clocked by a delayed outputted signal from said edge detector, said reset machine asserting a reset signal for at least one full cycle of said reference clock signal until said locked signal is detected, said reset signal applied to the external frequency divider.

2. A phase selector circuit used to synchronize an external frequency divider with a reference clock signal of a phase locked loop as recited in claim 1 wherein said synchronization divider has a divide magnitude equal to the frequency of the feedback clock signal divided by the frequency of the reference clock signal of the phase locked loop.

3. A phase selector circuit used to synchronize an external frequency divider with a reference clock signal of a phase locked loop as recited in claim 1 wherein said delayed feedback clock signal of the phase locked loop is provided by a delay block having an input receiving the feedback clock signal of the phase locked loop and an output providing said delayed feedback clock signal to a clock input of said edge detector.

4. A phase selector circuit used to synchronize an external frequency divider with a reference clock signal of a phase locked loop as recited in claim 3 wherein said output of said delay block providing said delayed feedback clock signal to a clock input of said synchronization divider.

5. A phase selector circuit used to synchronize an external frequency divider with a reference clock signal of a phase locked loop as recited in claim 1 wherein said delayed outputted signal from said edge detector is provided by a delay block having an input receiving the outputted signal from said edge detector and an output providing said delayed outputted signal to a clock input of said reset machine.

6. A phase selector circuit used to synchronize an external frequency divider with a reference clock signal of a phase locked loop as recited in claim 1 wherein the phase locked loop includes a predetermined delay in the feedback clock signal path.

7. A phase selector circuit used to synchronize an external frequency divider with a reference clock signal of a phase locked loop as recited in claim 1 wherein said synchronization divider includes a number of sequential states including said lock state; said synchronization divider having reset capability wherein each of said sequential states being reset to a next sequential state following said lock state responsive to said outputted signal of said edge detector.

8. A phase selector circuit used to synchronize an external frequency divider with a reference clock signal of a phase locked loop as recited in claim 7 wherein said number is equal to the frequency of the feedback clock signal divided by the frequency of the reference clock signal of the phase locked loop.

9. A phase selector circuit used to synchronize an external frequency divider with a reference clock signal of a phase locked loop as recited in claim 1 wherein the external frequency divider is continually reset by said reset machine until said lock signal is detected.

10. A method for synchronizing an external frequency divider with a reference clock signal of a phase locked loop, the external frequency divider located at the output of the phase locked loop outside the feedback clock signal path of the phase locked loop, said method comprising the steps of:

utilizing an edge detector for receiving the reference clock signal, clocking said edge detector with a delayed feedback clock signal of the phase locked loop, detecting a rising edge of the reference clock signal and outputting a signal for one full cycle of said delayed feedback clock, utilizing a synchronization divider for receiving said outputted signal from said edge detector, clocking said synchronization divider with said delayed feedback clock signal of the phase locked loop, detecting a lock state and outputting a lock signal for one full cycle of said delayed feedback clock, and utilizing a reset machine for receiving said lock signal from said synchronization divider, clocking said reset machine with a delayed outputted signal from said edge detector, asserting a reset signal for at least one full cycle of said reference clock signal until said locked signal is detected, and applying said reset signal to the external frequency divider, whereby the external frequency divider is continually reset by said reset machine until said locked signal is detected.

11. A method for synchronizing an external frequency divider with a reference clock signal of a phase locked loop as recited in claim 10 includes the steps of providing said synchronization divider with a predefined number of sequential states including said lock state and said synchronization divider having reset capability; wherein each of said sequential states being reset to a next sequential state following said lock state responsive to said outputted signal of said edge detector.

12. A clocking circuit comprising:

a phase locked loop, said phase locked loop having an output and having inputs receiving a reference clock signal and a feedback clock signal, an external frequency divider coupled to the output of the phase locked loop outside the feedback clock signal path of the phase locked loop, a phase selector circuit for synchronizing the external frequency divider with the reference clock signal of the phase locked loop; said phase selector circuit including:

an edge detector having an input receiving the reference clock signal, said edge detector having a clock input receiving a delayed feedback clock signal of the phase locked loop, said edge detector detecting a rising edge of the reference clock signal and outputting a signal, said outputted signal being asserted for one full cycle of said delayed feedback clock;

a synchronization divider having an input receiving said outputted signal from said edge detector, said synchronization divider having a clock input receiving said delayed feedback clock signal of the phase locked loop, said synchronization divider detecting a lock state and outputting a lock signal; said lock signal being asserted for one full cycle of said delayed feedback clock; and a reset machine having an input for receiving said lock signal from said synchronization divider, said reset machine having a clock input receiving a delayed outputted signal from said edge detector, said reset machine asserting a reset signal for at least one full cycle of said reference clock signal until said locked signal is detected, said reset signal applied to the external frequency divider.

13. A method for removing an external frequency divider and clock formation circuit from a feedback path of a phase locked loop, said method comprising the steps of:

applying a reference clock signal to the phase locked loop;

coupling an output of the phase locked loop through a predefined delay to provide a delayed feedback clock signal input to the phase locked loop;

locating the external frequency divider at the output of the phase locked loop external to the predefined delay and outside the feedback clock signal path of the phase locked loop;

utilizing a phase selector circuit and identifying a correct phase of the reference clock signal; and responsive to identifying said correct phase, starting the external frequency divider.

14. A method for removing an external frequency divider and clock formation circuit from a feedback path of a phase locked loop as recited in claim 13 includes the steps of providing said predefined delay for representing a delay of equal to a combined delay of the external frequency divider and clock formation circuit.

15. A method for removing an external frequency divider and clock formation circuit from a feedback path of a phase locked loop as recited in claim 13 includes the steps of providing said predefined delay for representing a delay of equal to a combined delay of the external frequency divider and clock formation circuit and a receiver circuitry delay of the reference clock signal.

* * * * *